United States Patent
Baars et al.

(10) Patent No.: US 7,374,992 B2
(45) Date of Patent: May 20, 2008

(54) MANUFACTURING METHOD FOR AN INTEGRATED SEMICONDUCTOR STRUCTURE

(75) Inventors: Peter Baars, Dresden (DE); Klaus Muemmler, Dresden (DE); Matthias Goldbach, Dresden (DE)

(73) Assignee: Qimonda AG, Munich (DE)

( * ) Notice: Subject to any disclaimer, the term of this patent is extended or adjusted under 35 U.S.C. 154(b) by 176 days.

(21) Appl. No.: 11/443,602

(22) Filed: May 31, 2006

(65) Prior Publication Data

US 2007/0281416 A1    Dec. 6, 2007

(51) Int. Cl.
*H01L 21/8234*    (2006.01)
(52) U.S. Cl. ............. 438/238; 438/210; 438/253; 438/254; 438/255; 438/256; 438/381; 438/393; 438/394; 438/395; 438/396; 257/E21.641
(58) Field of Classification Search ........... 438/210, 438/256, 394, 395
See application file for complete search history.

(56) References Cited

U.S. PATENT DOCUMENTS

| | | | |
|---|---|---|---|
| 6,506,647 B2 | 1/2003 | Kuroda et al. | |
| 2002/0042172 A1* | 4/2002 | Kuroda et al. | 438/197 |
| 2004/0029323 A1 | 2/2004 | Shimizu et al. | |
| 2006/0189051 A1 | 8/2006 | Kim | |

FOREIGN PATENT DOCUMENTS

| DE | 102004042167 | 3/2006 |
|---|---|---|
| KR | 100585180 | 5/2006 |

OTHER PUBLICATIONS

German Examination Report dated Jan. 18, 2007.

\* cited by examiner

*Primary Examiner*—Michael Lebentritt
*Assistant Examiner*—Kyoung Lee
(74) *Attorney, Agent, or Firm*—Eschwailer & Associates LLC

(57) ABSTRACT

The present invention provides a manufacturing method for an integrated semiconductor structure comprising the steps of: providing a semiconductor substrate having a plurality of gate stacks in a memory cell region and at least one gate stack in a peripheral device region; forming caps made of one or more layers of a cap material over said plurality of gate stacks in said memory cell region and over said at least one gate stack in said peripheral device region; forming a first contact hole between two neighboring gate stacks in said memory cell region; depositing a first protective layer over said memory cell region and peripheral device region; exposing said cap of said at least one gate stack in said peripheral device region; modifying said exposed cap of said at least one gate stack in said peripheral device region in a process step wherein said first protective layer acts as a mask in said memory cell region; forming a second protective layer over said modified cap in said peripheral device region; partly removing said first and second protective layer in order to bring said first and second protective layer to about a same upper level; removing said first protective layer from said first contact hole; forming at least one another contact hole in said peripheral device region, said at least one another contact hole exposing another contact area which is located either adjacent to said gate stack or in said gate stack in said peripheral device region; and filling said contact hole and said at least one another contact hole with a respective contact plug.

22 Claims, 20 Drawing Sheets

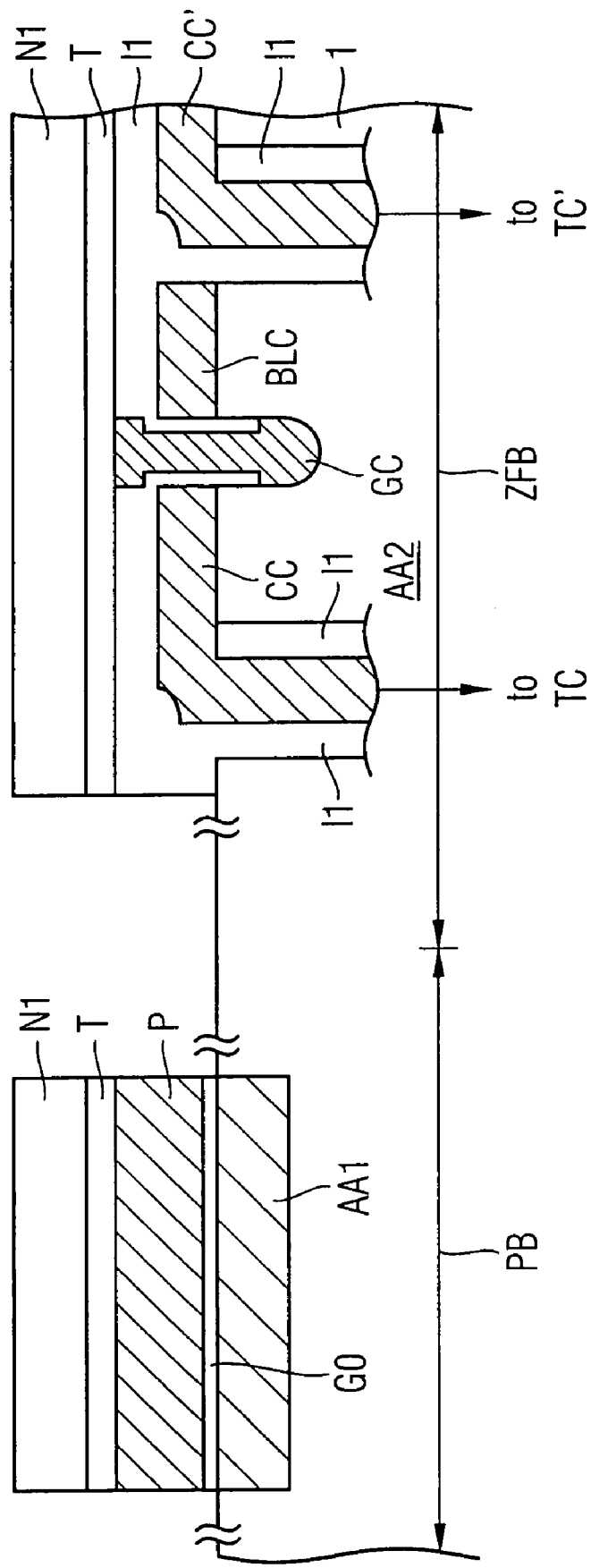

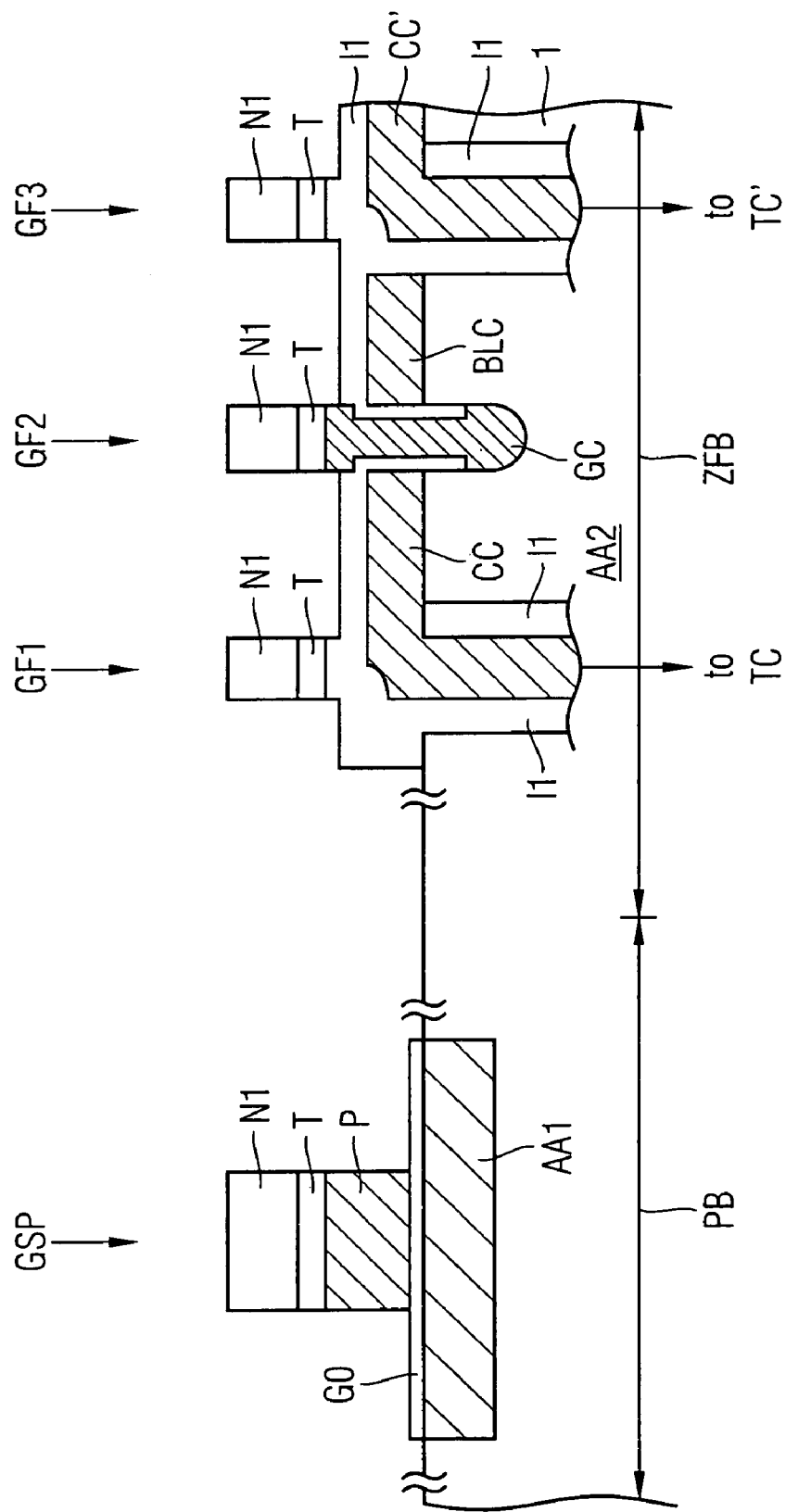

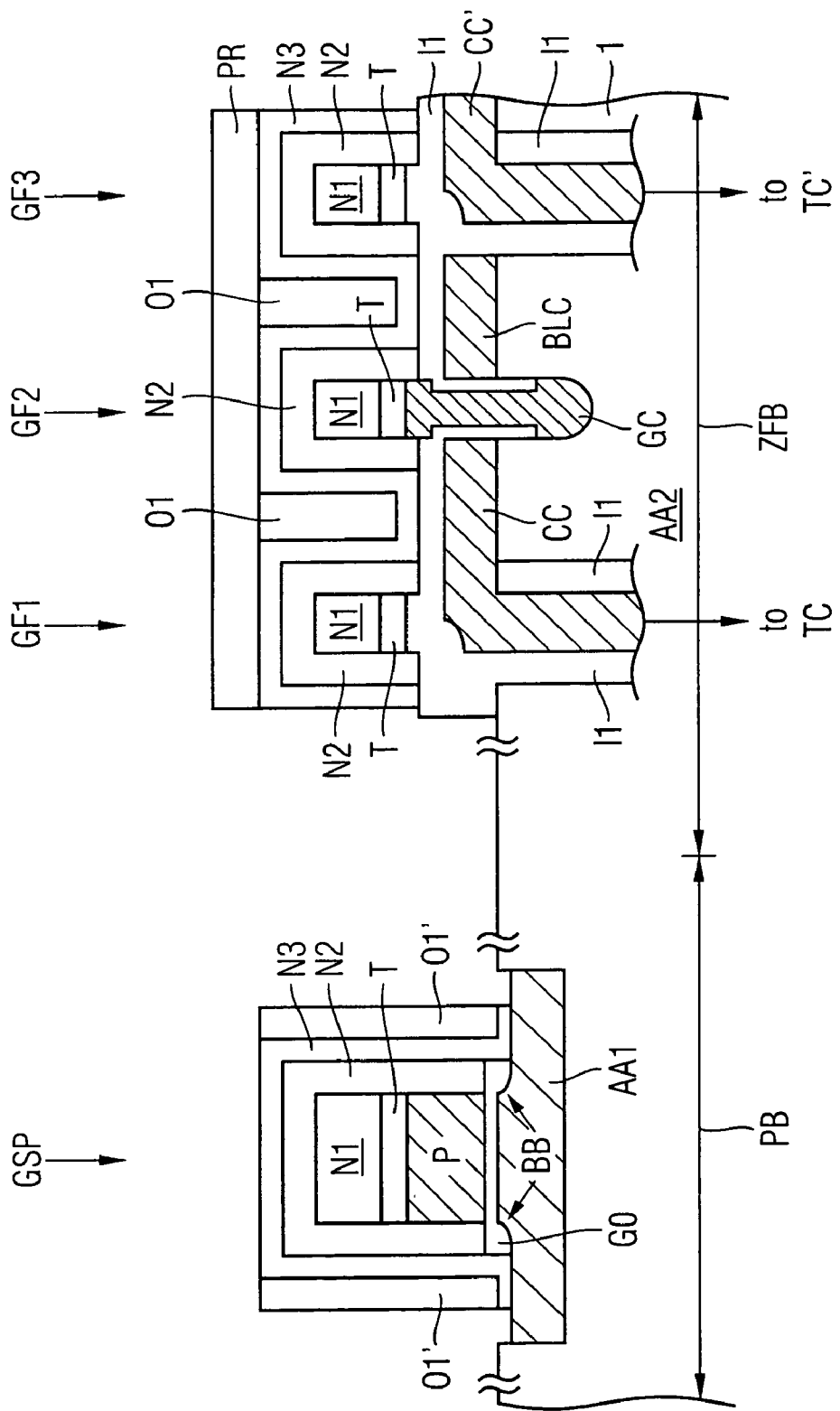

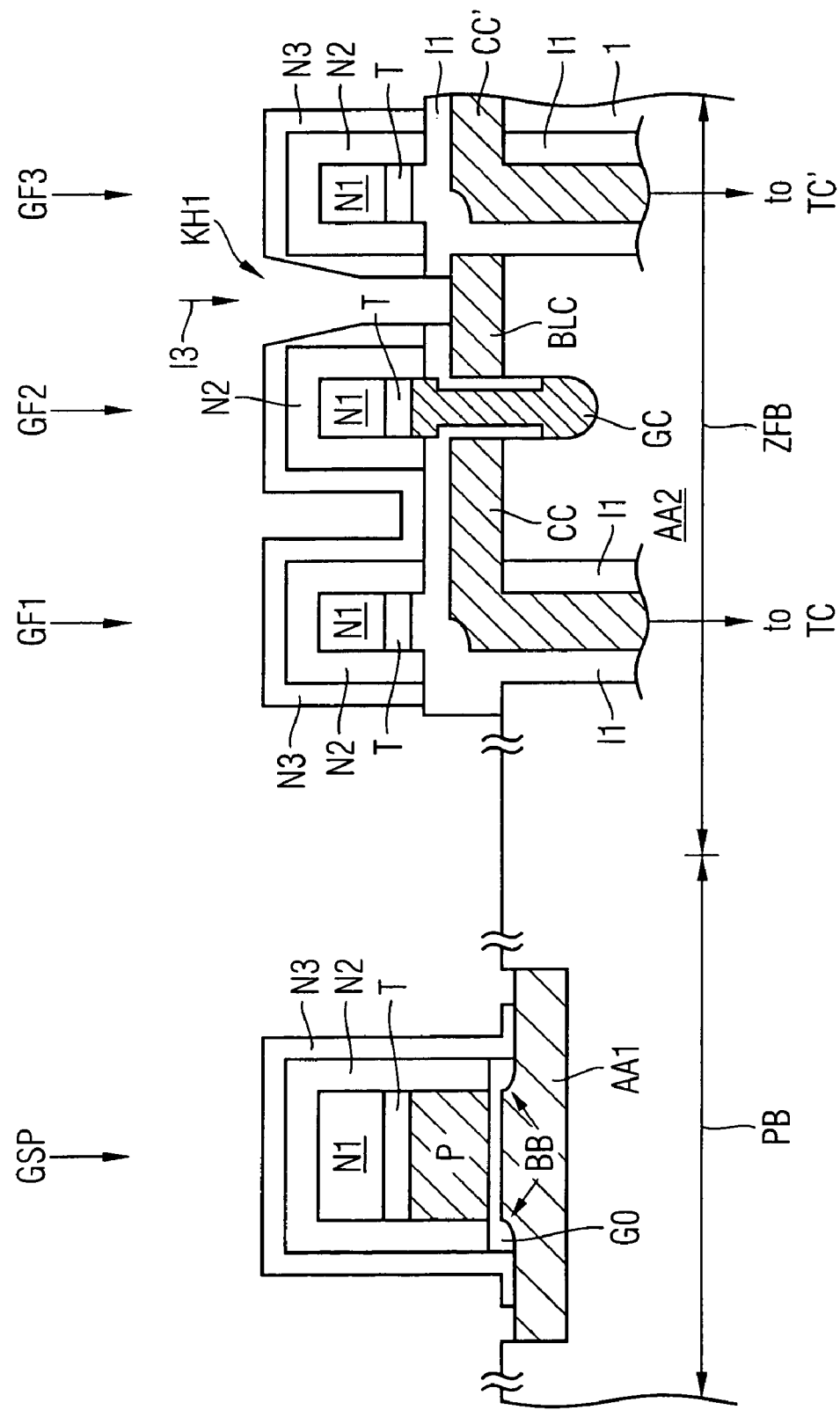

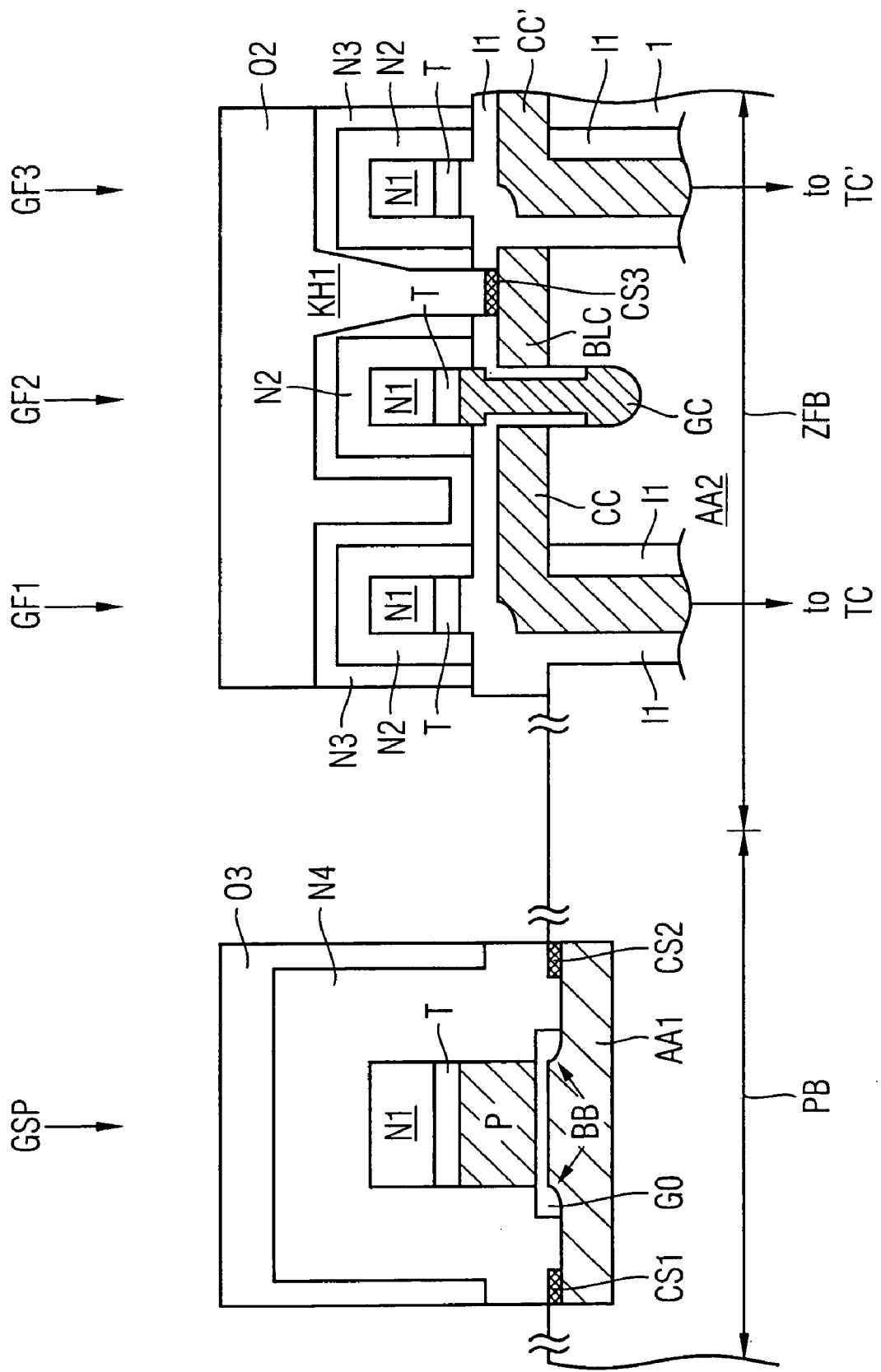

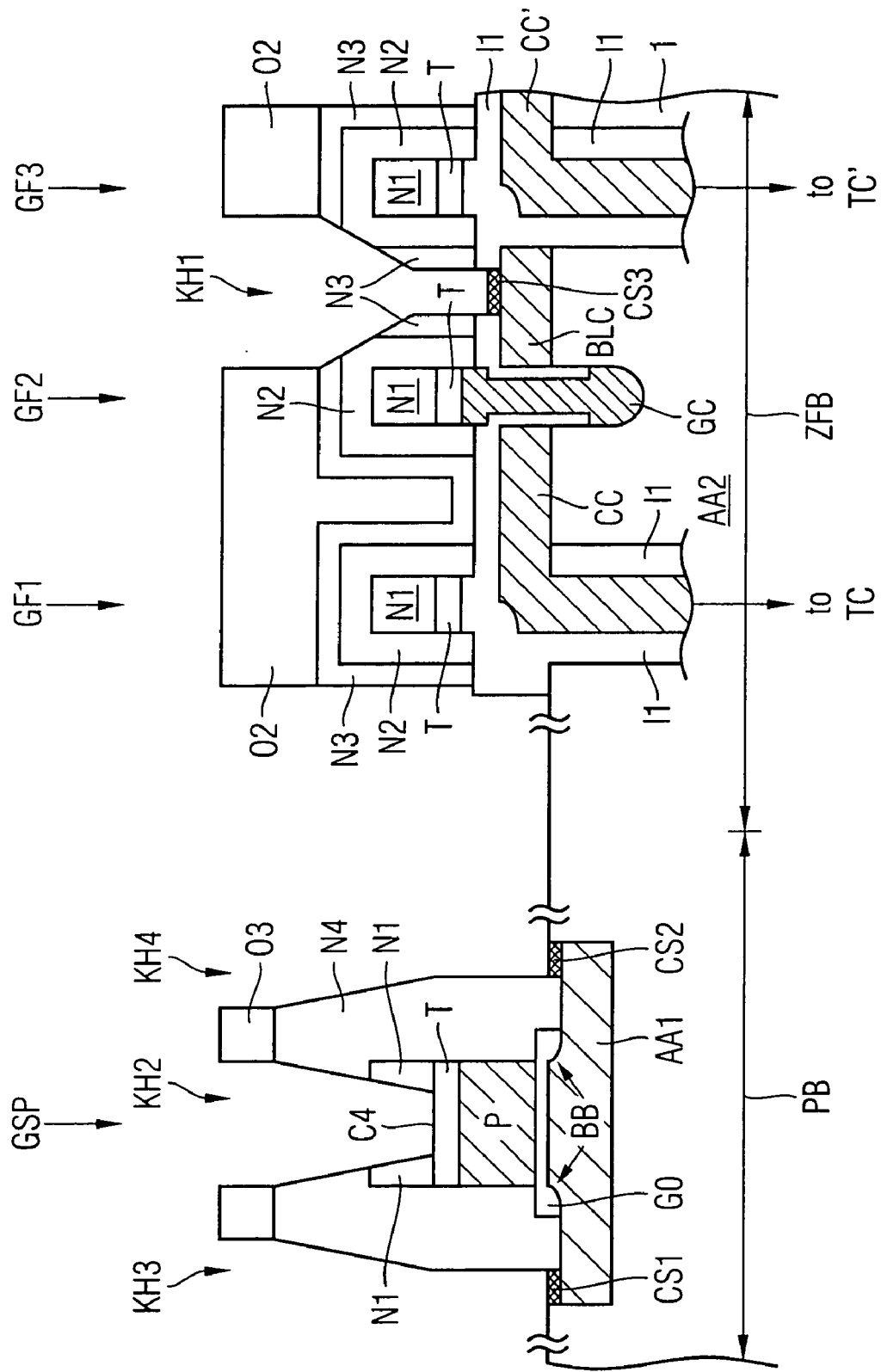

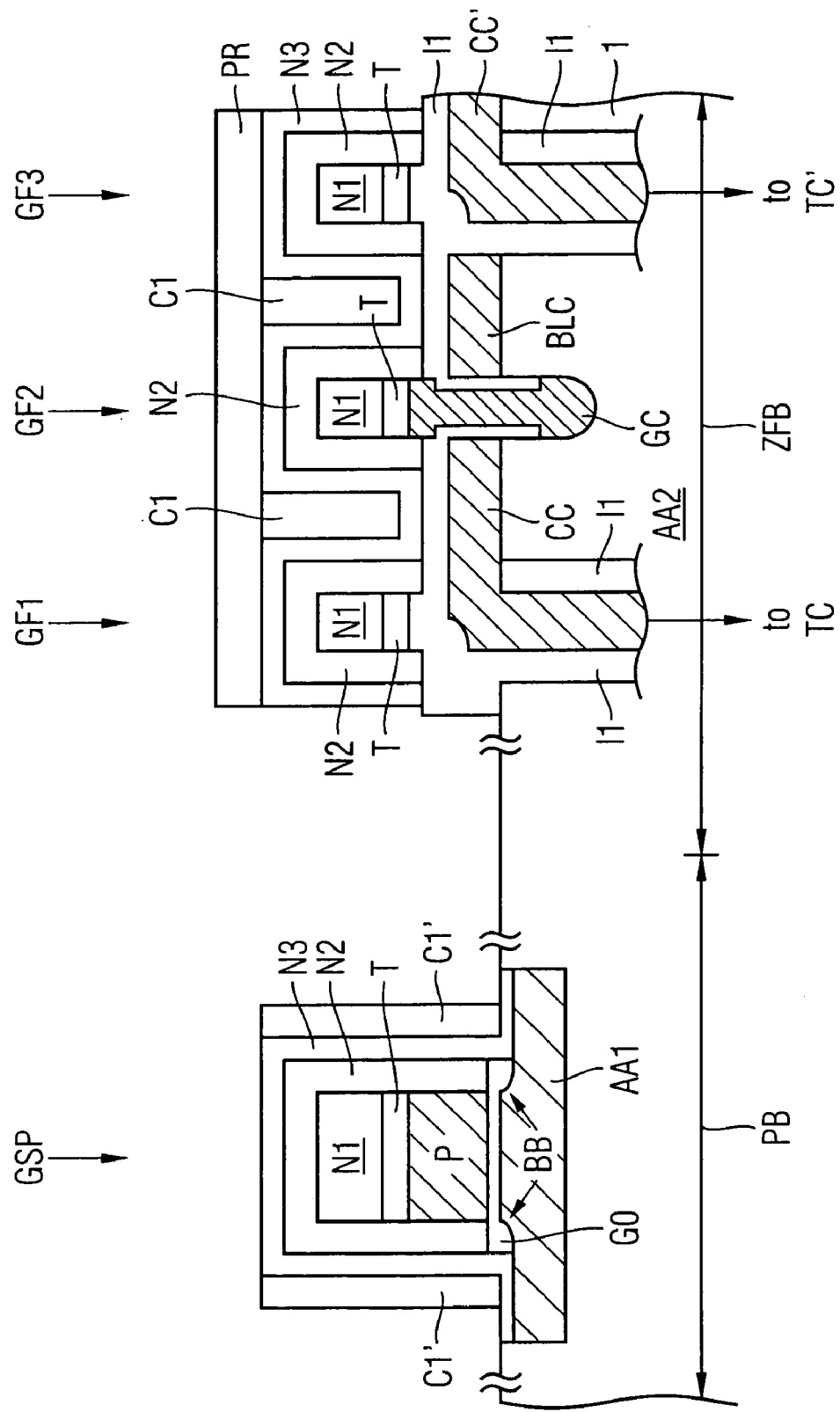

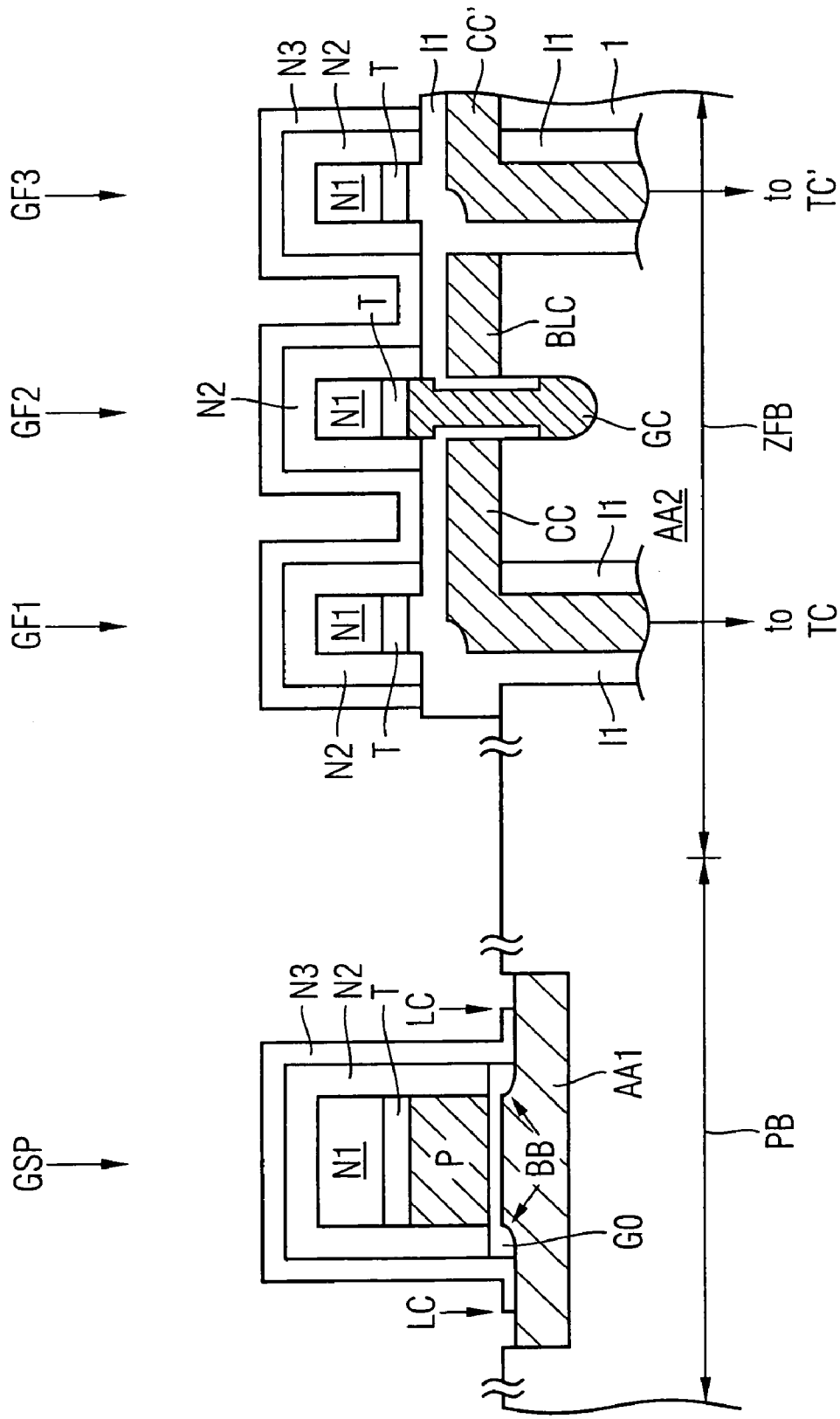

MANUFACTURING METHOD FOR AN INTEGRATED SEMICONDUCTOR STRUCTURE

BACKGROUND OF THE INVENTION

1. Field of the Invention

The present invention relates to a manufacturing method for an integrated semiconductor structure.

2. Description of the Related Art

Although in principle applicable to arbitrary integrated semiconductor structures, the following invention and the underlying problems will be explained with respect to integrated DRAM memory circuits in silicon technology.

The performance of integrated circuit metal oxide semiconductor transistors (MOSFETs) depends on a plurality of device parameters, such as gate dielectric thickness, transistor gate length and mobility of the charge carriers in the channel region. It is generally known that the application of stress in the transistor channel region is an important factor for increasing the carrier mobility. A number of methods have been utilized to apply stress to the transistor channel region including the formation of a high-stress liner over the transistor structure.

Silicon nitride stress liners are standard in logic process flows, but up to now not usable in DRAM process flows due to different array device processing steps. Currently, there is no applicable integration scheme which integrates a stress liner for peripheral transistors into a DRAM process flow such that an efficient process flow for manufacturing both array transistors and peripheral transistors can be achieved.

Moreover, it is generally known to provide gate stacks which are covered with insulating caps surrounding the electrical conductive gate conductors, which caps comprise a plurality of insulation layers. Hereinafter, the expression cap is used to define one or more insulation layer surrounding the electrical conductive gate conductors which may be present on top of and/or surrounding the electrical conductive gate conductors.

BRIEF SUMMARY OF THE INVENTION

According to a first aspect of the invention as claimed in claim 1, a manufacturing method for an integrated semiconductor structure comprises the steps of: providing a semiconductor substrate having a plurality of gate stacks in a memory cell region and at least one gate stack in a peripheral device region; forming caps made of one or more layers of a cap material over said plurality of gate stacks in said memory cell region and over said at least one gate stack in said peripheral device region; forming a first contact hole between two neighboring gate stacks in said memory cell region; depositing a first protective layer over said memory cell region and peripheral device region; exposing said cap of said at least one gate stack in said peripheral device region; modifying said exposed cap of said at least one gate stack in said peripheral device region in a process step wherein said first protective layer acts as a mask in said memory cell region; forming a second protective layer over said modified cap in said peripheral device region; partly removing said first and second protective layer in order to bring said first and second protective layer to about a same upper level; removing said first protective layer from said first contact hole; forming at least one other contact hole in said peripheral device region, said at least one other contact hole exposing another contact area which is located either adjacent to said gate stack or in said gate stack in said peripheral device region; and filling said contact hole and said at least one another contact hole with a respective contact plug.

According to a second aspect of the invention as claimed in claim 14, a manufacturing method for an integrated semiconductor structure comprises the steps of: providing a semiconductor substrate having a plurality of gate stacks in a memory cell region and at least one gate stack in a peripheral device region; forming caps made of three layers of a cap material over said plurality of gate stacks in said memory cell region and over said at least one gate stack in said peripheral device region; depositing a first protective layer over said memory cell region and peripheral device region; exposing said cap of said at least one gate stack in said peripheral device region; at least partly removing said exposed cap from said at least one gate stack in said peripheral device region and depositing and structuring an additional cap material layer over said at least one gate stack in said peripheral device region in order to form a modified cap, wherein said first protective layer acts as a mask in said memory cell region; forming a second protective layer over said modified cap in said peripheral device region; partly removing said first and second protective layer in order to bring said first and second protective layer to about a same upper level.

According to a second aspect of the invention as claimed in claim 17, a manufacturing method for an integrated semiconductor structure comprises the steps of: providing a semiconductor substrate having a plurality of gate stacks in a memory cell region and at least one gate stack in a peripheral device region; forming caps made of one or more layers of a cap material over said plurality of gate stacks in said memory cell region and over said at least one gate stack in said peripheral device region; forming a first contact hole between two neighboring gate stacks in said memory cell region; exposing said cap of said at least one gate stack in said peripheral device region; modifying said exposed cap of said at least one gate stack in said peripheral device region by removing said exposed cap from said at least one gate stack in said peripheral device region and depositing and structuring an additional cap material layer over said at least one gate stack in said peripheral device region in order to form a modified cap wherein said additional cap material layer is deposited and structured such that it forms a stress liner over said at least one gate stack in said peripheral device region; forming at least one another contact hole in said peripheral device region, said at least one another contact hole exposing another contact area which is located either adjacent to said gate stack or in said gate stack in said peripheral device region; and filling said contact hole and said at least one another contact hole with a respective contact plug.

The above defined aspects of the invention have the following advantages: Stress liner formation and silicidation steps can be easily implemented. Spacer for source/drain contacts in periphery can be completely made from nitride for self-aligned source/drain etch. Thick stress liner allows for larger source/drain contact's lithography critical dimension. The process flow is compatible to integrating different stress liners by subsequently applying different block masks, compressive or tensile stress liners, and etch processes. Source/drain contacts can be made self-aligned using the stress liner. Decoupled spacer thicknesses are possible for array and periphery. Silicide is integrated for peripheral as well as for array contacts.

Preferred embodiments are listed in the respective dependent claims.

According to a preferred embodiment, a third protective layer is formed between said caps of said plurality of gate stacks in said memory cell region and over said cap of said at least one gate stack in said peripheral device region; wherein a first spacer is structured from said third protective layer adjacent to said cap of said at least one gate stack in said peripheral device region; and wherein an etch step using said first spacer as a mask is performed to define the lateral dimensions of said another contact area which is located adjacent to said gate stack in said peripheral device region.

According to a further preferred embodiment, said another contact area which is located adjacent to said gate stack in said peripheral device region is formed by exposing a part of a corresponding first active area and thereafter performing a silicidation process step in said exposed part.

According to a further preferred embodiment, modifying said exposed cap of said at least one gate stack in said peripheral device region comprises the steps of at least partly removing said exposed cap from said at least one gate stack in said peripheral device region and depositing and structuring an additional cap material layer over said at least one gate stack in said peripheral device region in order to form a modified cap.

According to a further preferred embodiment, said additional cap material layer is deposited and structured such that is forms a stress liner over said at least one gate stack in said peripheral device region.

According to a further preferred embodiment, said stress liner comprises an n-FET transistor tensil stress liner and wherein said additional cap material layer subjected to the following steps: forming a thin oxide as a hard mask, exposing p-FET transistors, wet etching said oxide in a lithography step; and wet thinning or removal of said additional cap material layer over said p-FETs leaving said additional cap material layer over said n-FET transistors.

According to a further preferred embodiment, said stress liner comprises an p-FET compressive stress liner and wherein the following steps are performed: forming a compressive stress liner over said p-FET transistors, forming a thin oxide as a hard mask exposing n-FET transistors, wet etching said oxide in a lithography step; and wet thinning or removal said compressive stress liner over said n-FET transistors leaving said compressive stress liner over said p-FET transistors.

According to a further preferred embodiment, said cap comprises a first, second and third nitride layer.

According to a further preferred embodiment, said first, second and third protective layers are silicon oxide layers.

According to a further preferred embodiment, the thickness of said additional cap material layer is chosen such that said at least one another contact hole exposing another contact area which is located adjacent to said gate stack in said peripheral device region can be formed in self-aligned manner.

According to a further preferred embodiment, a third protective layer is formed between said caps of said plurality of gate stacks in said memory cell region and over said cap of said at least one gate stack in said peripheral device region; wherein a first spacer is structured from said third protective layer adjacent to said cap of said at least one gate stack in said peripheral device region; wherein an ion implantation step is performed using said first spacer to define the separation of said other contact area to the actual channel of said peripheral device.

According to a further preferred embodiment, after said ion implantation step the remaining first protective layer is removed; and wherein a fourth protective layer is formed between said caps of said plurality of gate stacks in said memory cell region and over said cap of said at least one gate stack in said peripheral device region; wherein a second spacer is structured from said fourth protective layer adjacent to said cap of said at least one gate stack in said peripheral device region; and wherein an etch step using said second spacer as a mask is performed to define the lateral dimensions of said another contact area which is located adjacent to said gate stack in said peripheral device region.

According to a further preferred embodiment, said fourth protective layer is made of carbon.

DESCRIPTION OF THE DRAWINGS

In the Figures:

FIG. 2A-D show schematic cross-sections of a manufacturing method for an integrated semiconductor structure according to a second embodiment of the present invention.

In the Figures, identical reference signs denote equivalent or functionally equivalent components.

DESCRIPTION OF THE PREFERRED EMBODIMENTS

Figure 1C:
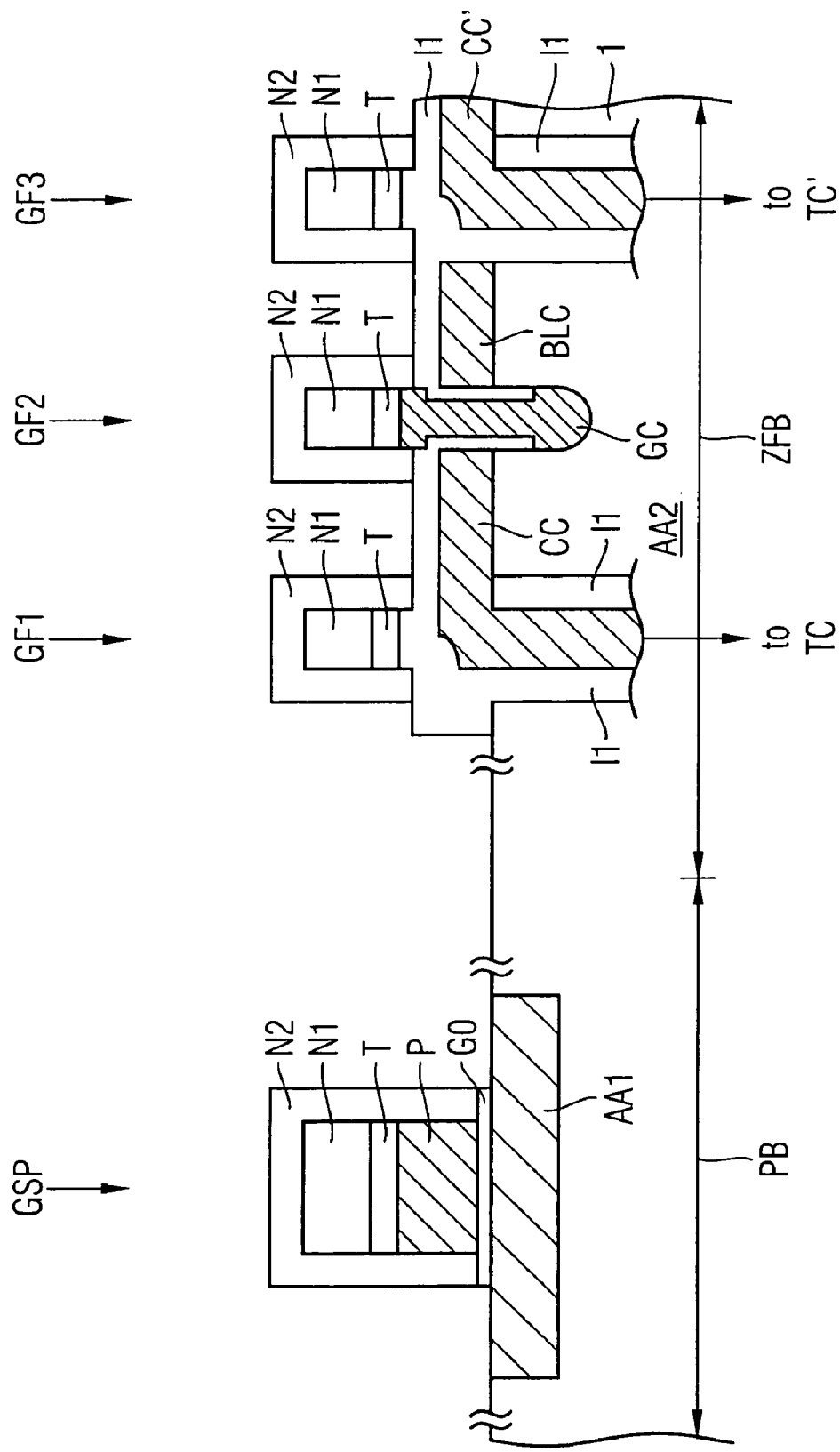
FIG. 1A-P show schematic cross-sections of a manufacturing method for an integrated semiconductor structure according to a first embodiment of the present invention.
Figure 1D:
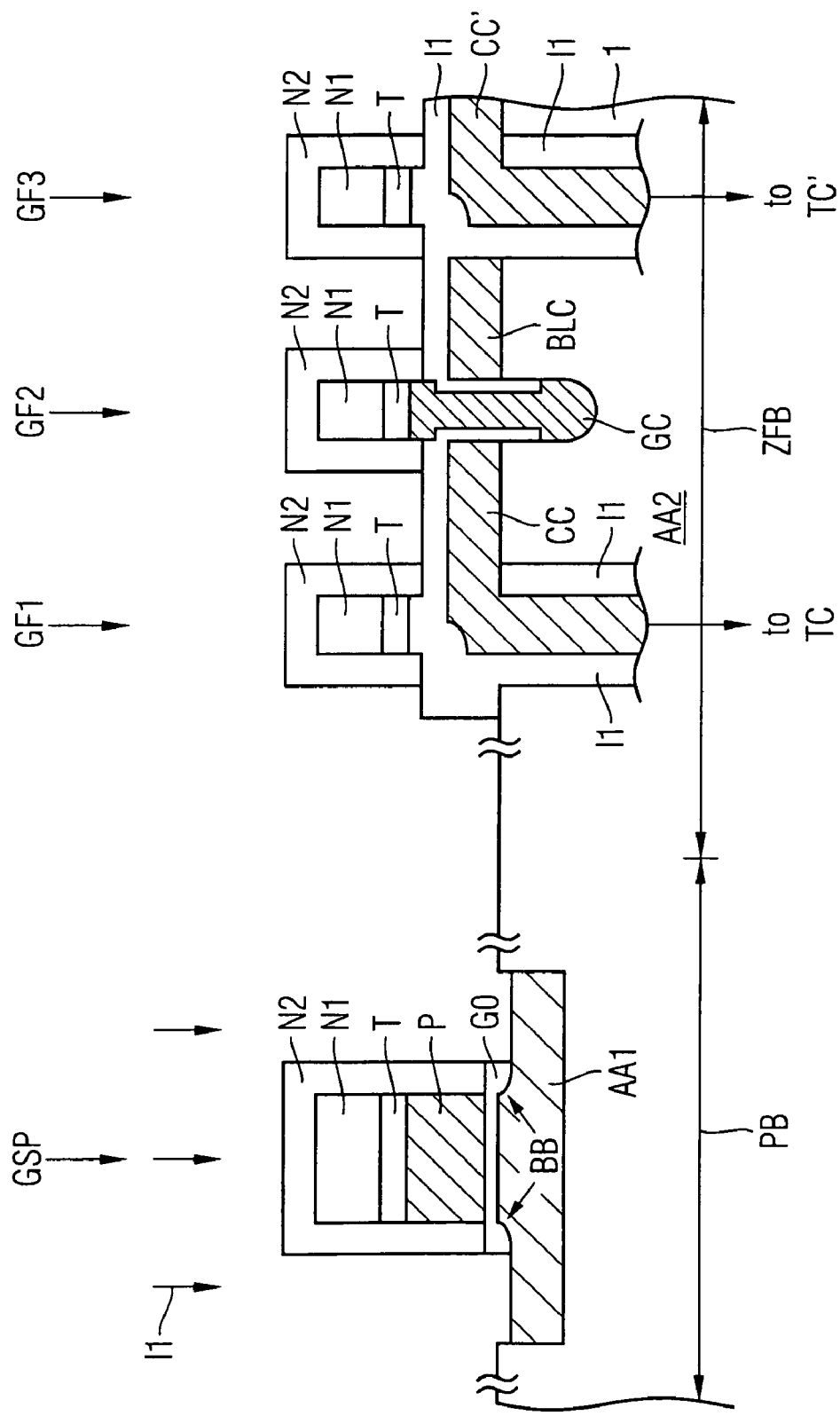
Figure 1E:
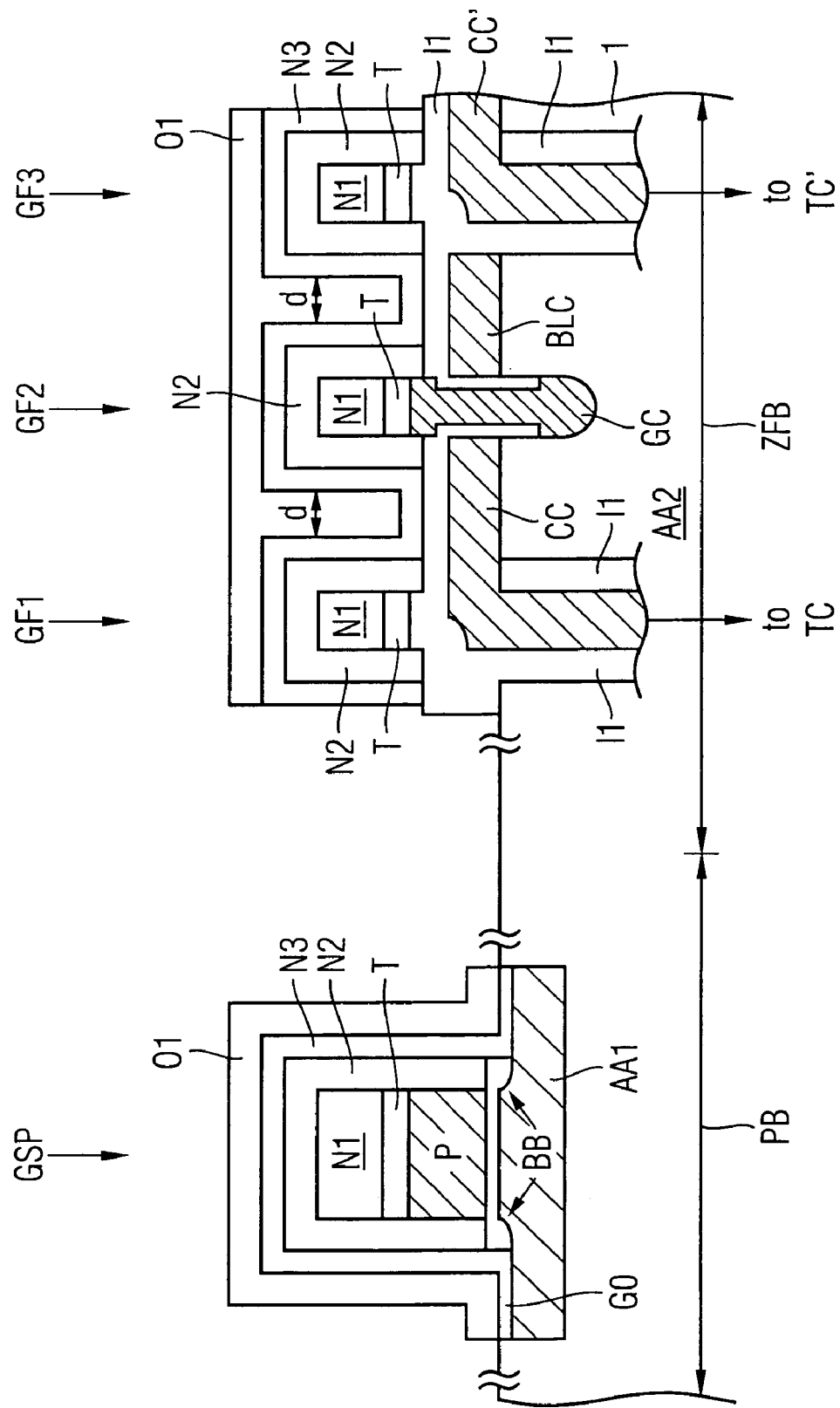
Figure 1F:
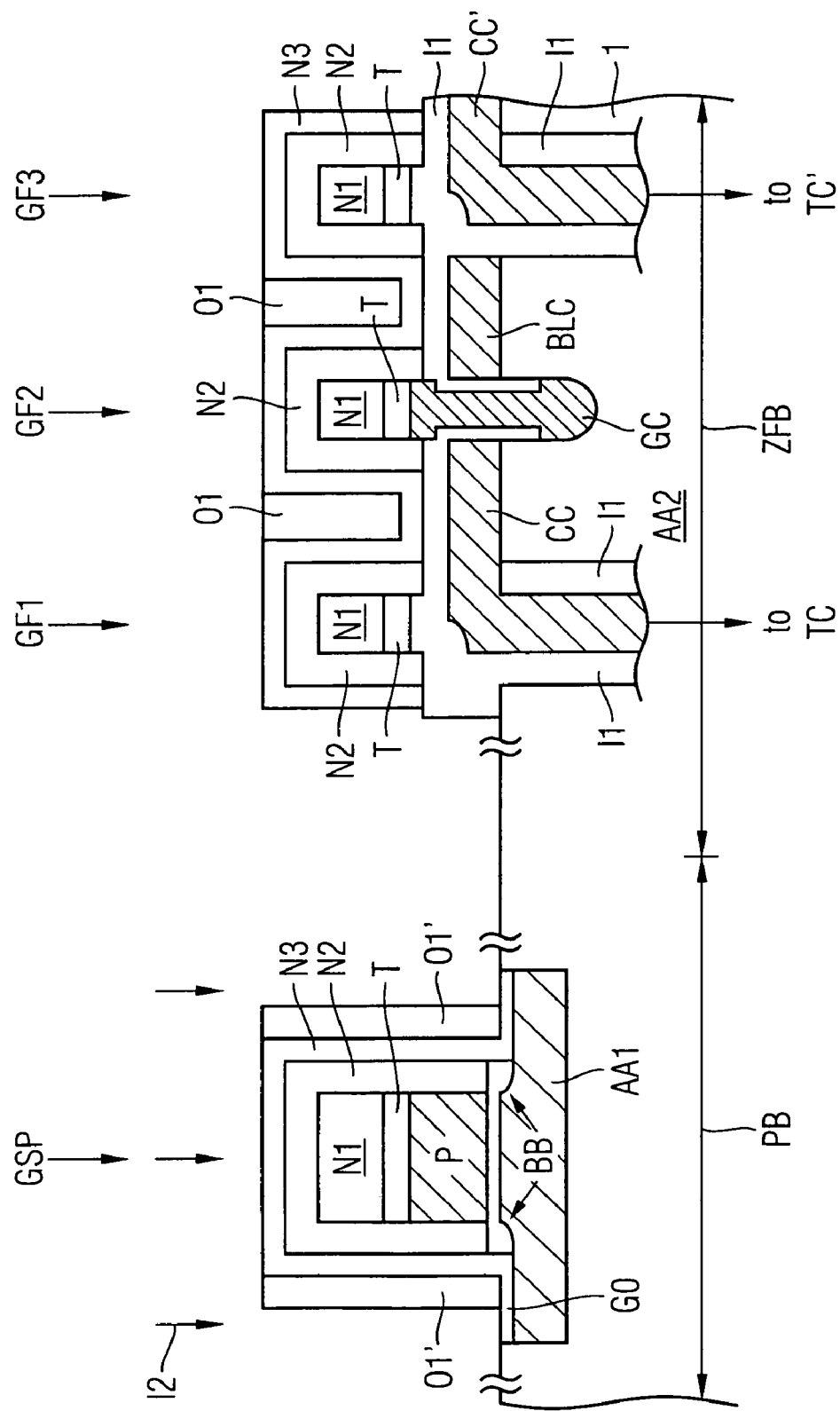
Figure 1H:
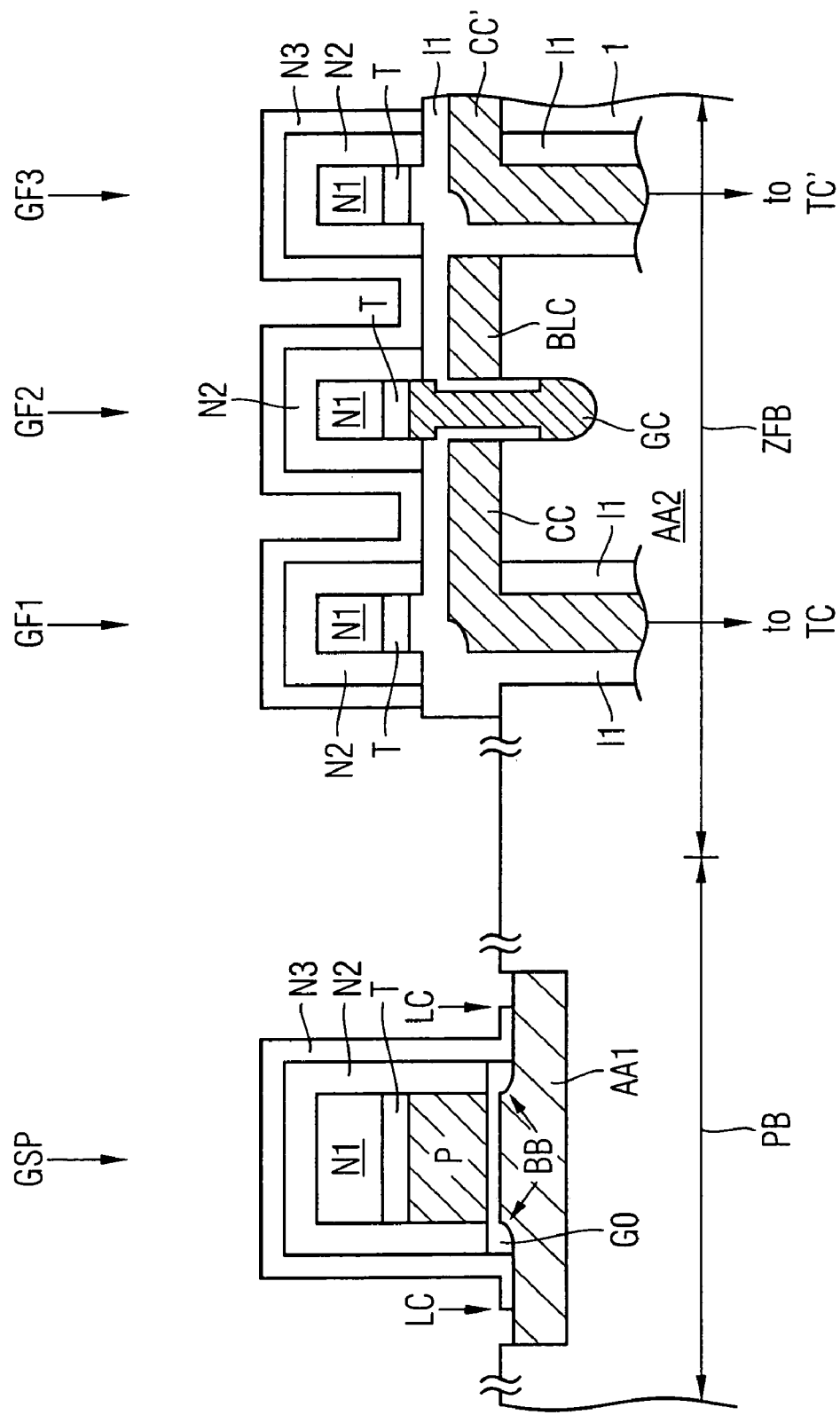
Figure 1J:
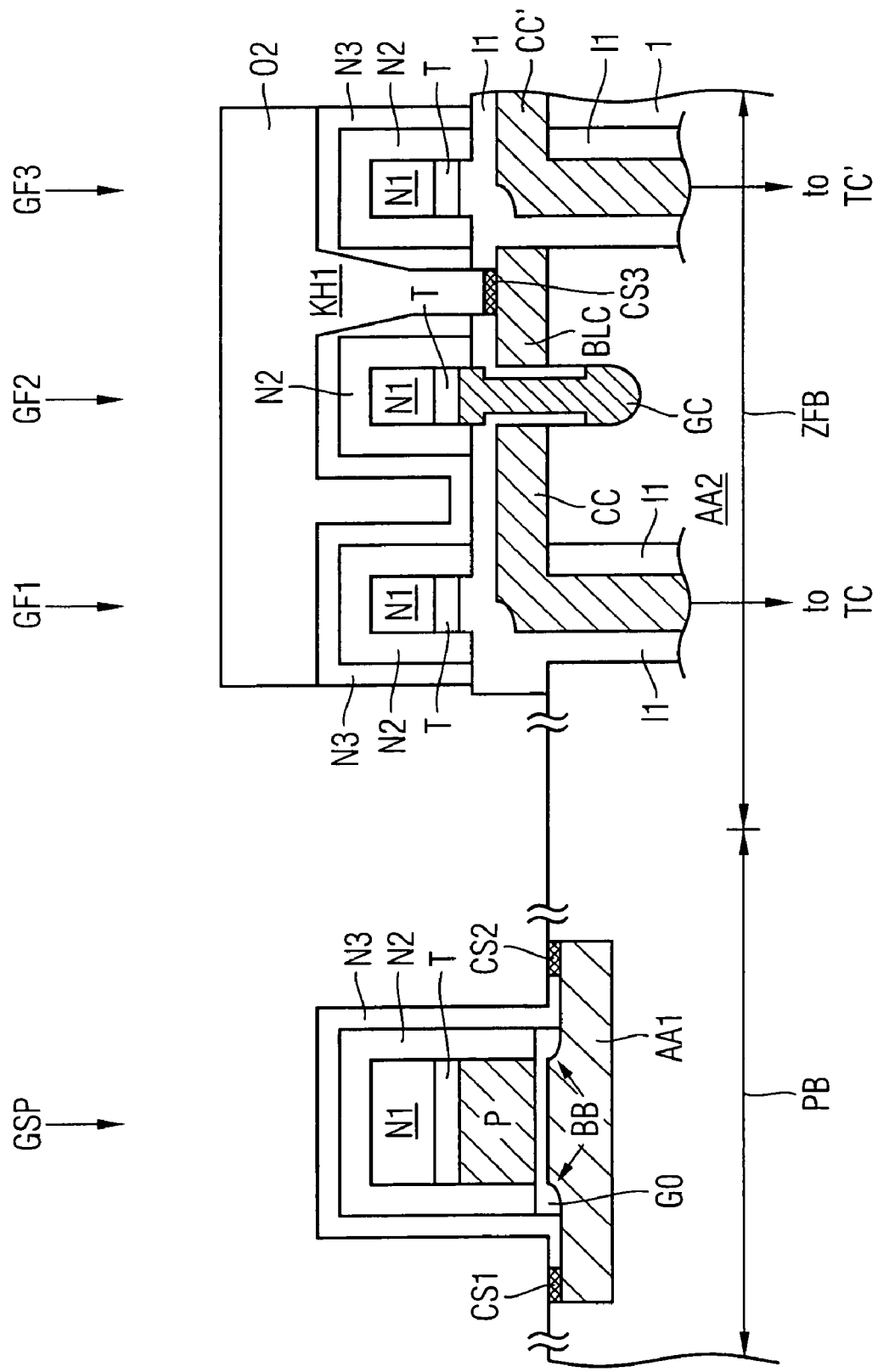
Figure 1K:
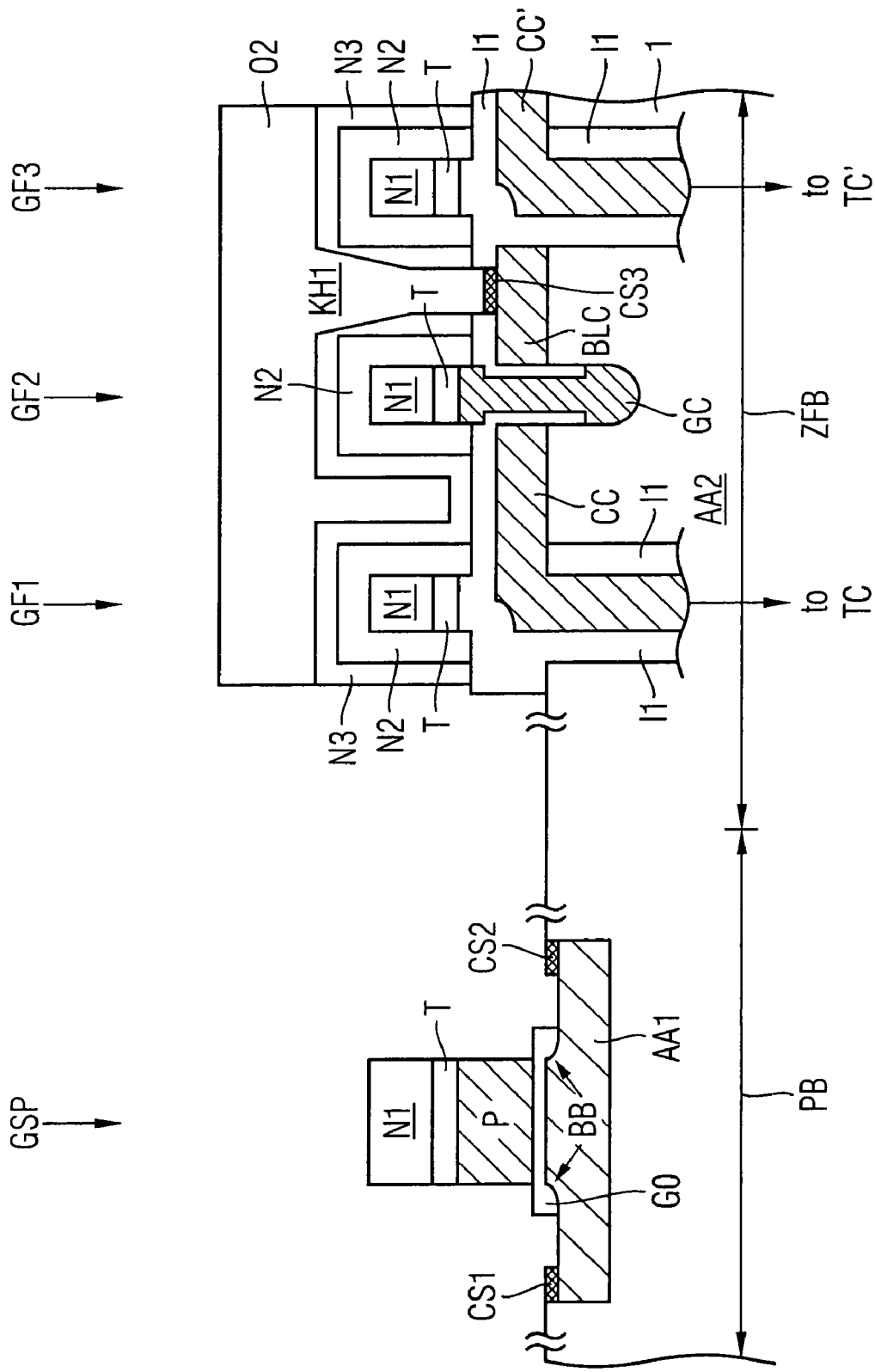
Figure 1L:
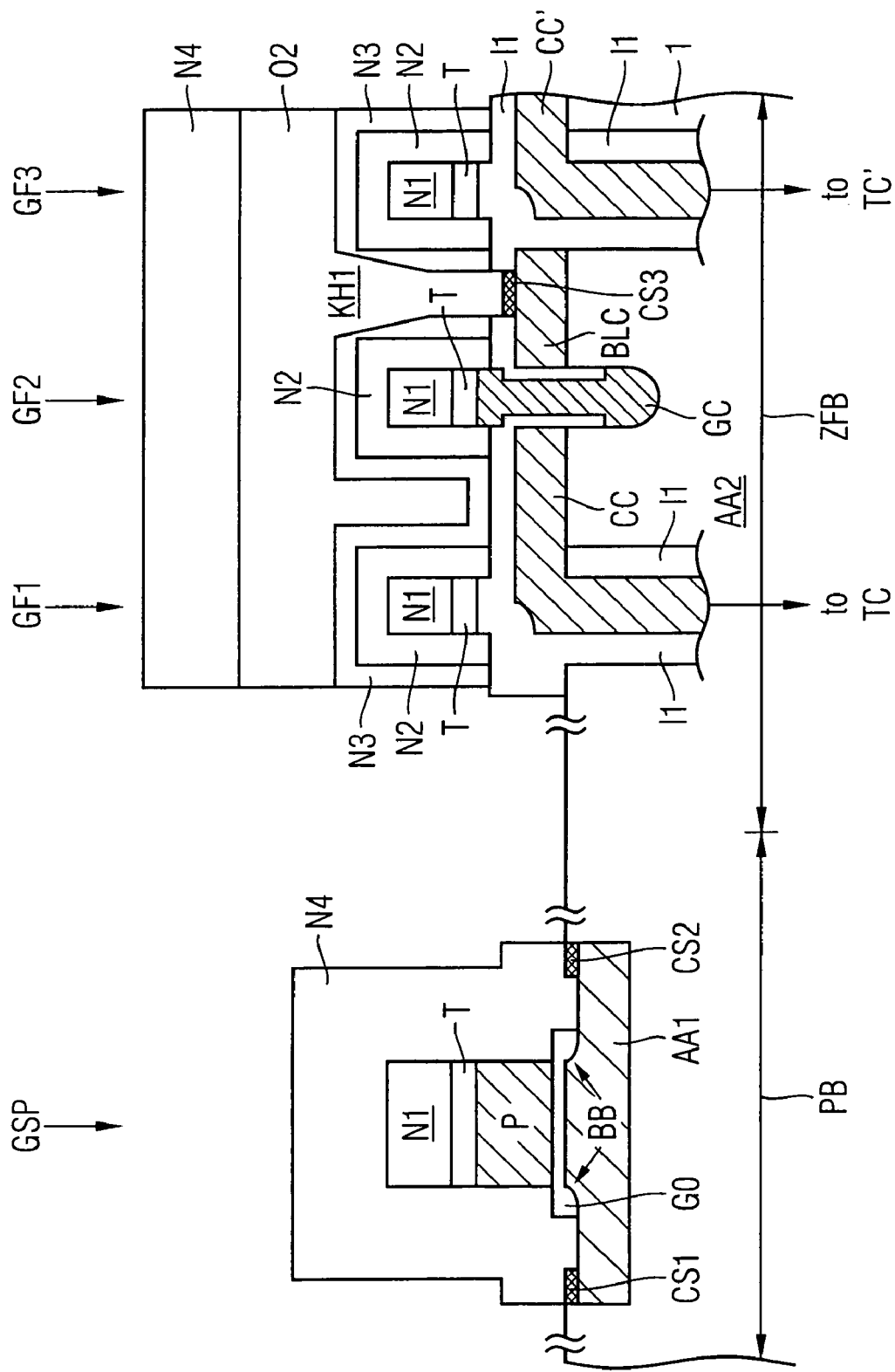
Figure 1M:
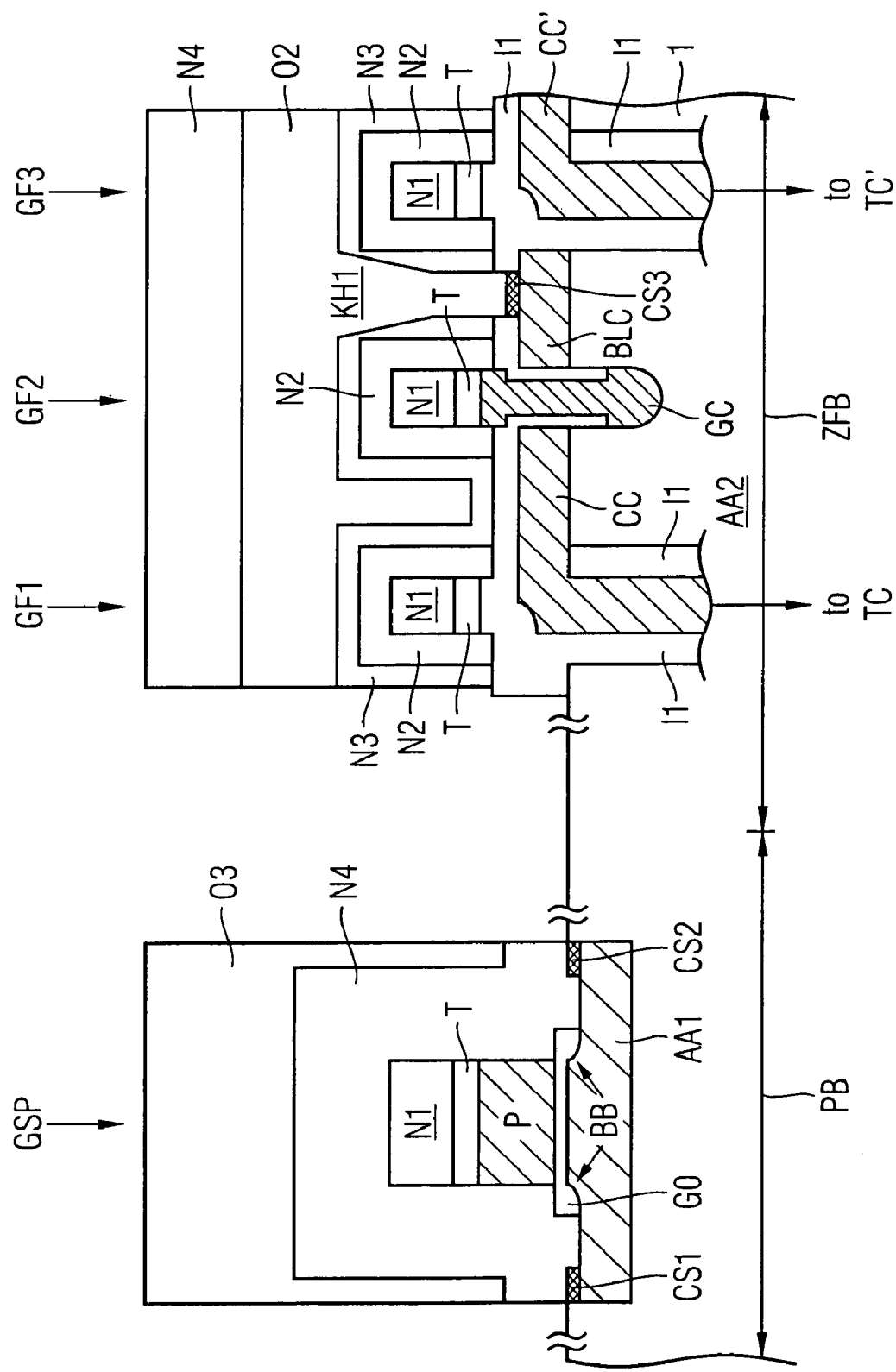
Figure 1P:
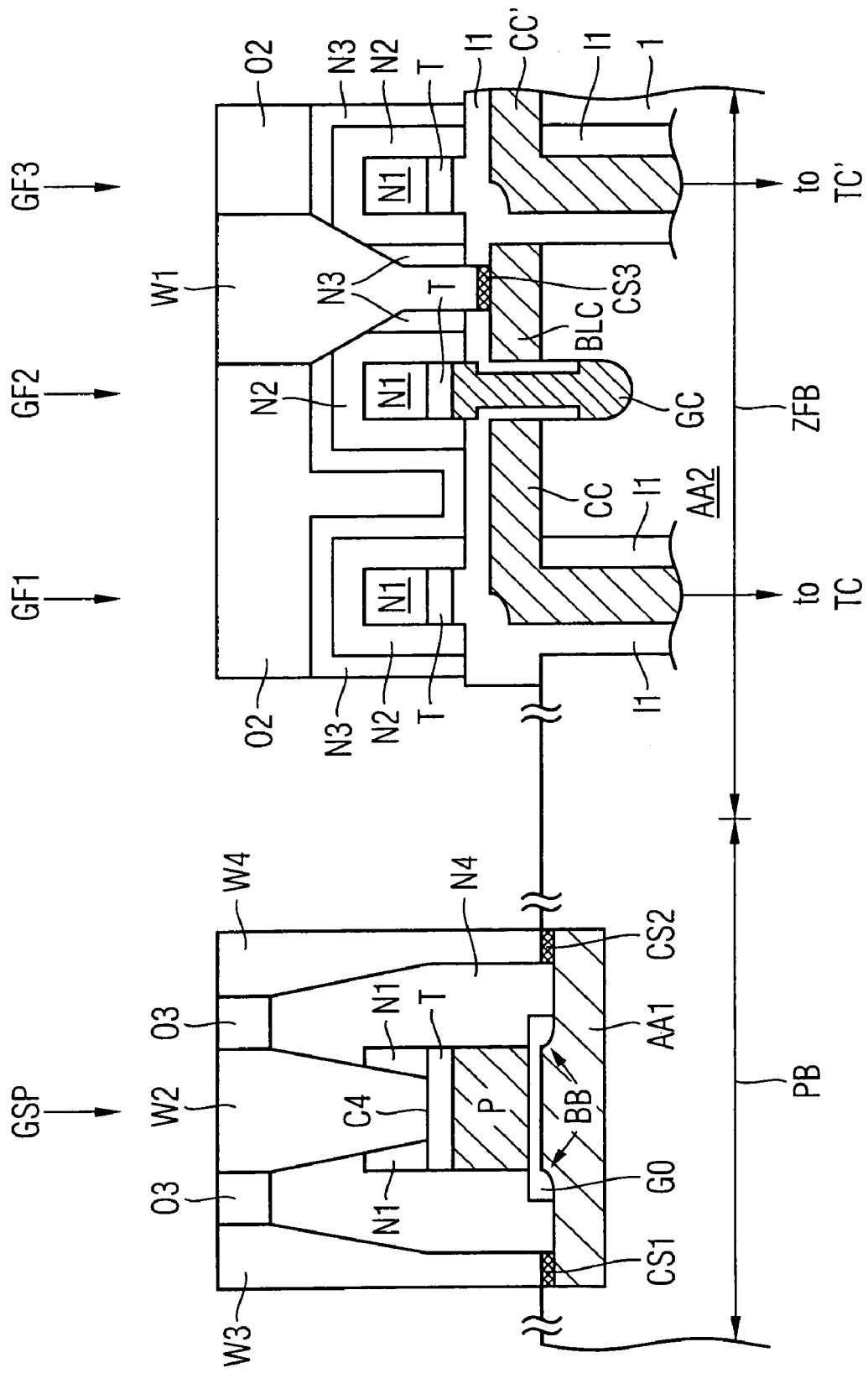

FIG. 1A-P show schematic cross-sections of a manufacturing method for an integrated semiconductor structure according to a first embodiment of the present invention.

In FIG. 1A, reference sign 1 denotes a silicon semiconductor substrate having a peripheral device region PB and a memory cell region ZFB. In the peripheral device region PB, a first active area AA1 is provided in the substrate 1. On the main surface of the substrate 1, a thin gate dielectric layer GO is provided, for example a gate oxide layer. Although this gate dielectric layer GO is also present in the memory cell region ZFB, it is only depicted in the peripheral device region PB for the sake of clarity. Moreover, in the peripheral device region, a polysilicon layer P is provided on the gate dielectric layer GO, a tungsten layer T is provided on the polysilicon layer P, and a first nitride layer N1 is provided on the tungsten layer T.

In the active area AA2 of the memory cell region ZFB, there is an EUD transistor (EUD=extended u-groove device) having a gate conductor GC. As mentioned above, the gate dielectric layer GO underlying the gate conductor GC in the memory cell region ZFB is not shown. Moreover, reference sign CC denotes a capacitor connection line which connects the drain side of the EUD transistor to a trench capacitor TC which is buried in the substrate 1 and also not shown here.

On the source side of the EUD transistor there is a bitline connection line BLC. All of the capacitor connection line CC, the bitline connection line BLC and the gate conductor GC are made of polysilicon. They are electrically insulated by a first insulation layer 11 made of silicon oxide and partly in electrical contact with the substrate 1. The tungsten layer T which is present both in the peripheral device region PB and the memory cell region ZFB lies in the latter region on the first insulation layer 11 and contacts the gate conductor GC from above. As in the peripheral device region PB, also in the. memory cell region ZFB the first nitride layer N1 is on top of the tungsten layer T.

Reference sign CC' in FIG. 1A denotes another capacitor connection line which belongs to a neighboring EUD transistor which is not shown in FIG. 1A-P and which connects the drain side of the neighboring EUD transistor to a trench capacitor TC' which is buried in the substrate 1 and also not shown here.

In a first process step which starts at the process status shown in FIG. 1A, respective gate stacks GSB, GF1, GF2, GF3 are formed in the peripheral device region PB and in the memory cell region ZFB by a lithography process step and by a subsequent etch step, as shown in FIG. 1B.

In the peripheral device region PB, a gate stack GSP of a peripheral transistor is formed by structuring the first nitride layer N1, the tungsten layer T and the polysilicon layer P. In the memory cell region ZFB, a first, second and third gate stack GF1, GF2, GF3 are formed by structuring the first nitride layer N1 and the tungsten layer T. Gate stack GF2 belongs to the EUD transistor shown in the cross-sections of FIG. 1A-P, whereas gate stacks GF1 and GF3 belong to EUD transistors located in other cross-sections. Gate stacks GF1, GF2, GF3 are not formed in the same process step as gate stack GSP. Thus, in the memory cell region ZFB, a slight overetch into the first insulation layer I1 made of silicon oxide may be advantageously obtained.

In a subsequent process step which is shown in FIG. 1C, a second nitride layer is deposited over the peripheral device region PB and the memory cell region ZFB and thereafter subjected to a nitride spacer etch in order to form nitride spacers N2 surrounding said gate stacks GSP, GF1, GF2, GF3. In this process step, also the part of the gate oxide layer GO which surrounds the gate stack GSP is removed. The purpose of the nitride spacer N2 is to define an implant region in the active area AA1.

Thereafter, as shown in FIG. 1D, an oxidation step is performed optionally in order to oxidize a part of the silicon of the first active area AA1 surrounding said gate stack GSP so as to form bird's beak regions BB under gate stack GSP. Thereafter, the oxide surrounding gate stack GSP is removed in an oxide etch step using said nitride spacer N2 as a mask in order to expose the upper surface of the first active area AA1 surrounding said gate stack GSP.

Then, an ion implantation step is performed in order to introduce impurities into the first active area AA1. The nitride spacer N2 defines the minimum separation of the implanted area to the actual channel of the device.

In a next process step which is shown in FIG. 1E, a third nitride layer N3 is deposited over the peripheral device region PB and the memory cell region ZFB such that the third nitride layer N3 serves the purpose to define a distance between the gate stacks GF1, GF2, GF3 in the memory cell region ZFB. Thereafter, a first oxide layer O1, e.g. made of TEOS, is deposited over the entire structure, i.e. over the peripheral device region PB and the memory cell region ZFB. The first oxide layer O1 serves to protect the nitride layer N3 in the memory cell region ZFB and serves to define a mask for the third nitride layer N3 in the peripheral device region PB. Possible voids (not shown here) existing in the first oxide layer O1 in the spaces between the gate stacks GF1, GF2, GF3 would not cause any problems as long as the first oxide layer O1 suffices to protect the nitride layer N3 in the memory cell region ZFB in a later nitride etch step.

As depicted in FIG. 1F, an oxide spacer etch is performed on the first oxide layer O1 which leaves the first oxide layer O1 in the space between the gate stacks GF1, GF2, GF3 and on the sidewalls of the gate stack GSP. In the peripheral device region PB, the oxide spacer etch exposes a part of the upper surface of the third nitride layer N3 surrounding the remaining spacer O1' of the first oxide layer O1. Then, another ion implantation step I2 is performed into the first active area AA1 using said spacers O1' of the first oxide layer O1 as a mask. This ion implantation step I1 is performed through the exposed parts of the third nitride layer N3 into the active area AA1 and has no effect in the memory cell region ZFB.

In a subsequent process step which is illustrated in FIG. 1G, the memory cell region ZFB and (not shown) parts of the peripheral device region PB are covered with a photoresist layer PR which serves as a protection layer. Then, a nitride spacer etch is performed in order to expose the first active area AA1 in the region surrounding the spacers O1' made of the first oxide layer O1. The parts that are covered by the resist are not etched away during this process and will serve later on as a silicidation block layer.

As illustrated in FIG. 1H, the photoresist layer PR is stripped after said nitride spacer etch, and thereafter the first oxide layer O1 and the spacers O1' made thereof, respectively, are stripped in a wet etch step both in the peripheral device region PB and the memory cell region ZFB. The lower corners LC of the remaining third nitride layer N3 on the active area AA1 form a nitride alignment etch for a silicide (e.g. CoSi) formation step to be carried out later.

With reference to FIG. 1I, a planarizing lithography step is performed followed by an reactive ion etch step in order to form a contact hole KH1 which after breakthrough of the third nitride layer N3 and first insulation layer I1 made of oxide exposes the bitline connection line BLC. Thereafter, another implantation step I3 is performed into the contact hole KH in order to reduce the contact resistance of the bitline connection line BLC. Then, the (not shown) photomask of the lithography step is removed.

As depicted in FIG. 1J, silicide contact areas CS1, CS2, CS3 are formed on the exposed regions of the first active area AA1 in the peripheral device region PB and on the bitline connection line BLC in the memory cell region ZFB by a silicidation process (e.g. by self-aligned silicidation). Here, the remaining parts of the nitride protection layer N3 (i.e. said silicidation block layer) prevent some regions from being silicided which is not shown in the cross sections.

In a subsequent process step, a second oxide layer O2 is deposited over the entire structure and thereafter removed from the peripheral device region PB by block lithography and oxide etch steps leaving only the memory cell region ZFB covered. If the second oxide layer O2 is a spin-on-glass oxide layer, the removal of the second oxide layer O2 from the peripheral device region PB in the above-mentioned lithography/etch steps may be easily carried out in an anisotropic spin-on glass etch step followed by a short wet dip etch which preferably has a selectivity of 6:1 or better with respect to a (not shown) STI oxide (Shallow Trench Insulation) in the peripheral device region PB. Thereafter, the (not shown) photoresist block mask is removed from the memory cell region ZFB.

With reference to FIG. 1K, a wet nitride etch step is performed to thin the nitride cap of gate stack GSP in the peripheral device region PB. During this wet nitride etch step, the second oxide layer O2 serves as a mask in the memory cell region ZFB. After the nitride wet etch step, only a thin cap of the first nitride layer N1 remains on top of the gate stack GSP, whereas the nitride layers N2; N3 have been fully removed from the top and the sidewalls of the gate stack GSP.

As depicted in FIG. 1L, a fourth nitride layer N4 as a conformal layer is deposited over the entire structure which serves as a stress liner over the gate stack GPS in the peripheral device region. In the memory cell region ZFB, the second oxide layer O2 protects gate stacks GF1, GF2, GF3 from the fourth nitride layer N4. The fourth nitride layer N4 is a specially manufactured nitride layer and well-known in the state of the art. The fourth nitride layer N4 can be a non-conformal layer, although in this embodiment it is shown as a conformal layer.

For example, said stress liner comprises an n-FET transistor tensil stress liner and said additional cap material layer is subjected to the following steps: forming a thin oxide as a hard mask, exposing p-FET transistors, wet etching said oxide in a lithography step; and wet thinning or removal of said additional cap material layer over said p-FETs leaving said additional cap material layer over said n-FET transistors.

For example, said stress liner comprises an p-FET compressive stress liner and the following steps are performed: forming a compressive stress liner over said p-FET transistors, forming a thin oxide as a hard mask exposing n-FET transistors, wet etching said oxide in a lithography step; and wet thinning or removal said compressive stress liner over said n-FET transistors leaving said compressive stress liner over said p-FET transistors.

Optionally, the fourth nitride layer N4 could be replaced by a normal nitride layer deposited over the structure of FIG. 1J under omission of the wet etch nitride step of FIG. 1K. It should also be mentioned that the thickness of the fourth nitride layer N4 is preferably designed such that the sidewalls thereof can be used to define contact hole walls in a self-aligned manner for contact holes to be provided later which contact the silicide contact areas CS1, CS2.

Thereafter, as shown in FIG. 1M, a third oxide layer O3 is deposited over the entire structure, preferably in the form of a spin-on glass layer. In a following chemical-mechanical polishing step, the third oxide layer O3 is polished down to the level of the upper surface of the fourth nitride layer N4 in the memory cell region ZFB which serves as a polish stop.

As illustrated in FIG. 1M, a reactive ion etch step is performed on the structure of FIG. 1M in order to fully remove the fourth nitride layer N4 from the memory cell region CFB and simultaneously removing the same amount of the oxide layer O3 in the periphery device region PB. Thereafter, the second and third oxide layer O2, O3 in the memory cell region ZFB and in the peripheral device region PB, respectively, have about the same upper level (see FIG. 1N). Optionally, a getter layer can be deposited on top of the whole structures (not shown here).

With reference to FIG. 1O, a (not shown) hardmask is formed on the entire structure and structured such that contact hole KH1 can be re-opened and the silicide contact area CS3 can be exposed. Then, the (not shown) hardmask is removed, and another lithography step using a (not shown) photomask is performed in order to form contact holes KH2, KH3, KH4 in the peripheral device region PB. Although shown as being located in one cross-section, only contact holes KH3 and KH4 are normally located in the cross-section of FIG. 1O, whereas contact hole KH2 is located in another cross-section. Contact hole KH2 exposes the tungsten region of gate stack GSP, whereas contact holes KH3 and KH4 expose silicide contact areas CS1 and CS2, respectively. Contact hole KH2 is for providing a gate contact area C4, contact holes KH3 and KH4 for providing a source and a drain contact in the silicide contact areas CS1 and CS2 of the shown transistor of the peripheral device region PB, respectively. Contact hole KH1 in the memory cell region ZFB is used for providing a bitline contact. After contact holes KH2, KH3, KH4 have been formed, the (not shown) photoresist mask is removed.

Finally, as shown in FIG. 1P, contact holes KH1, KH2, KH3, KH4 are filled with tungsten, thereafter the tungsten is polished back by a chemical-mechanical polishing step which leads to the structure of FIG. 1P where contact plugs W1, W2, W3, W4 are formed in former contact holes KH1, KH2, KH3, KH4, respectively.

FIG. 2A-D show schematic cross-sections of a manufacturing method for an integrated semiconductor structure according to a second embodiment of the present invention.

Figure 2A:
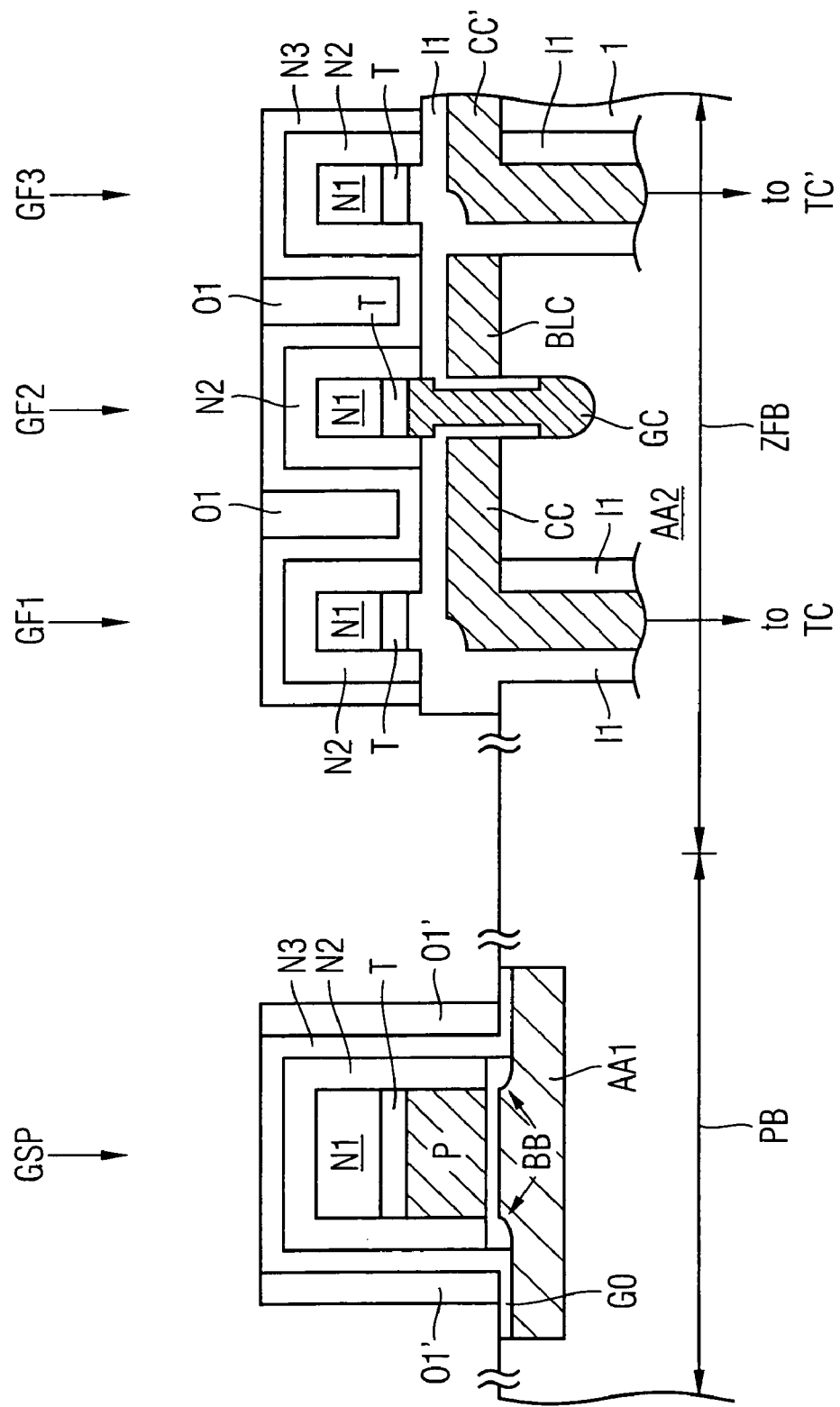

The process flow of the second embodiment starts at the process state of FIG. 2A which corresponds to the process state of FIG. 1F explained above.

Figure 2B:
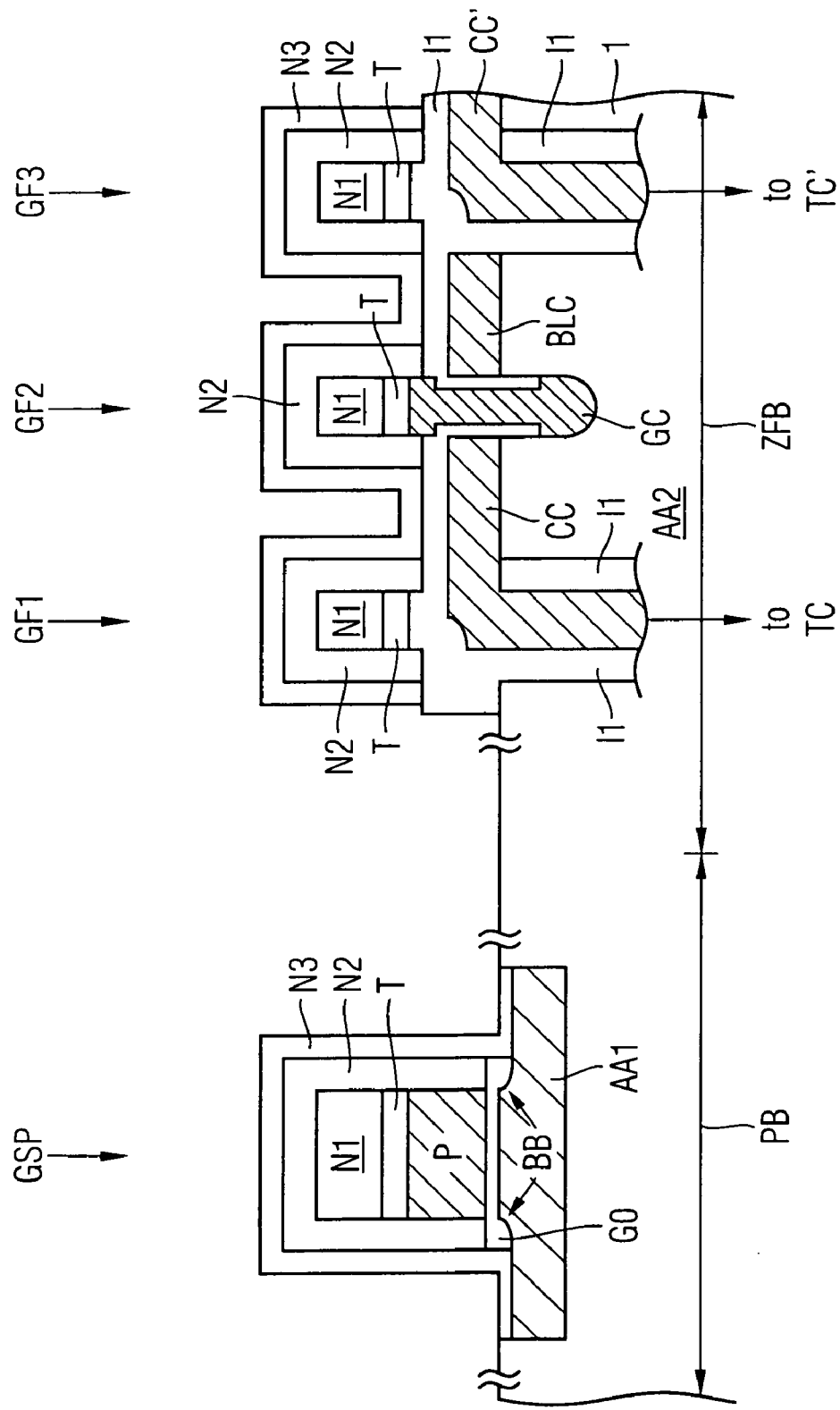

In a subsequent process step, the first oxide layer O1 in the memory cell region ZFB and the spacers O1' made thereof in the peripheral device region PB, respectively, are stripped by wet etching which leads to the process state shown in FIG. 2B.

As depicted in FIG. 2C, a carbon layer C1 is deposited over the structure of FIG. 2B and subjected to a carbon spacer etch which leaves carbon spacers C1' on gate stack GSP in the peripheral device region PB and carbon fillings made of said carbon layer Cl between the gate stacks GF1, GF2, GF3 in the memory cell region ZFB.

Thereafter, a photoresist layer PR is provided in the memory cell region ZFB and in some (not illustrated) parts of the peripheral device region PB, as explained above with respect to FIG. 1G.

Thereafter, as shown in FIG. 2D, using the spacer C1' of the carbon layer C1 as a mask in the peripheral device region PB and the photoresist layer PR as a mask in the memory cell region ZFB, the nitride alignment edges at the lower corners LC of the third nitride layer N3 in the peripheral device region PB for the silicide contact areas CS1, CS2 to be formed on the first active area AA1 later are etched by a nitride spacer etch which exposes corresponding portions of the first active area AA1.

Thereafter, the carbon spacers C1' on gate stack GSP in the peripheral device region PB and carbon fillings made of said carbon layer C1 in the memory cell region ZF are removed by a selective etch step.

The process steps of the second embodiment following the process state of FIG. 2G fully correspond to the process steps already explained with respect to FIG. 1I to 1P, and therefore a repeated description thereof will be omitted.

Although the present invention has been described with reference to a preferred embodiment, it is not limited thereto, but can be modified in various manners which are obvious for a person skilled in the art. Thus, it is intended that the present invention is only limited by the scope of the claims attached herewith.

The invention claimed is:

1. A manufacturing method for an integrated semiconductor structure comprising the steps of:
   providing a semiconductor substrate having a plurality of gate stacks in a memory cell region and at least one gate stack in a peripheral device region;
   forming caps made of one or more layers of a cap material over said plurality of gate stacks in said memory cell region and over said at least one gate stack in said peripheral device region;
   forming a first contact hole between two neighboring gate stacks in said memory cell region;
   depositing a first protective layer over said memory cell region and peripheral device region;
   exposing said cap of said at least one gate stack in said peripheral device region;

modifying said exposed cap of said at least one gate stack in said peripheral device region in a process step wherein said first protective layer acts as a mask in said memory cell region;
forming a second protective layer over said modified cap in said peripheral device region;
partly removing said first and second protective layer in order to bring said first and second protective layer to about a same upper level;
removing said first protective layer from said first contact hole;
forming at least one another contact hole in said peripheral device region, said at least one another contact hole exposing another contact area which is located either adjacent to said gate stack or in said gate stack in said peripheral device region; and
filling said contact hole and said at least one another contact hole with a respective contact plug.

2. The method according to claim 1, wherein a third protective layer is formed between said caps of said plurality of gate stacks in said memory cell region and over said cap of said at least one gate stack in said peripheral device region; wherein a first spacer is structured from said third protective layer adjacent to said cap of said at least one gate stack in said peripheral device region; and wherein an etch step using said first spacer as a mask is performed to define the lateral dimensions of said another contact area which is located adjacent to said gate stack in said peripheral device region.

3. The method according to claim 1 or 2, wherein said another contact area which is located adjacent to said gate stack in said peripheral device region is formed by exposing a part of a corresponding first active area and thereafter performing a silicidation process step in said exposed part.

4. The method according to claim 1, wherein modifying said exposed cap of said at least one gate stack in said peripheral device region comprises the steps of at least partly removing said exposed cap from said at least one gate stack in said peripheral device region and depositing and structuring an additional cap material layer over said at least one gate stack in said peripheral device region in order to form a modified cap.

5. The method according to claim 1, wherein said additional cap material layer is deposited and structured such that it forms a stress liner over said at least one gate stack in said peripheral device region.

6. The method according to claim 5, wherein said stress liner comprises an n-FET transistor tensil stress liner and wherein said additional cap material layer subjected to the following steps: forming a thin oxide as a hard mask, exposing p-FET transistors, wet etching said oxide in a lithography step; and wet thinning or removal of said additional cap material layer over said p-FETs leaving said additional cap material layer over said n-FET transistors.

7. The method according to claim 6, wherein said stress liner comprises an p-FET compressive stress liner and wherein the following steps are performed: forming a compressive stress liner over said p-FET transistors, forming a thin oxide as a hard mask exposing n-FET transistors, wet etching said oxide in a lithography step; and wet thinning or removal said compressive stress liner over said n-FET transistors
leaving said compressive stress liner over said p-FET transistors.

8. The method according to claim 1, wherein said cap comprises a first, second and third nitride layer.

9. The method according to claim 1, wherein said first, second and third protective layers are silicon oxide layers.

10. The method according to claim 4, wherein the thickness of said additional cap material layer is chosen such that said at least one another contact hole exposing another contact area which is located adjacent to said gate stack in said peripheral device region can be formed self-aligned to said silicided contact areas.

11. The method according to claim 1, wherein a third protective layer is formed between said caps of said plurality of gate stacks in said memory cell region and over said cap of said at least one gate stack in said peripheral device region; wherein a first spacer is structured from said third protective layer adjacent to said cap of said at least one gate stack in said peripheral device region (PB); wherein an ion implantation step is performed into said other contact area which is located adjacent to said gate stack in said peripheral device region and uses the first spacer to define the minimum separation of the implants to the actual channel of the device.

12. The method according to claim 11, wherein after said ion implantation step the remaining first protective layer is removed; and wherein a fourth protective layer is formed between said caps of said plurality of gate stacks in said memory cell region and over said cap of said at least one gate stack in said peripheral device region; wherein a second spacer is structured from said fourth protective layer adjacent to said cap of said at least one gate stack in said peripheral device region; and wherein an etch step using said second spacer as a mask is performed to define the lateral dimensions of said other contact area which is located adjacent to said gate stack in said peripheral device region.

13. The method according to claim 11, wherein said fourth protective layer is made of carbon.

14. A manufacturing method for an integrated semiconductor structure comprising the steps of:
providing a semiconductor substrate having a plurality of gate stacks in a memory cell region and at least one gate stack in a peripheral device region;
forming caps made of three layers of a cap material over said plurality of gate stacks in said memory cell region and over said at least one gate stack in said peripheral device region;
depositing a first protective layer over said memory cell region and peripheral device region;
exposing said cap of said at least one gate stack in said peripheral device region;
at least partly removing said exposed cap from said at least one gate stack in said peripheral device region and depositing and structuring an additional cap material layer over said at least one gate stack in said peripheral device region in order to form a modified cap, wherein said first protective layer acts as a mask in said memory cell region;
forming a second protective layer over said modified cap in said peripheral device region;
partly removing said first and second protective layer in order to bring said first and second protective layer to about a same upper level.

15. The method according to claim 14, wherein said additional cap material layer is deposited and structured such that is forms a stress liner over said at least one gate stack in said peripheral device region.

16. The method according to claim 14, wherein said cap comprises a first, second and third nitride layer.

17. A manufacturing method for an integrated semiconductor structure comprising the steps of:

providing a semiconductor substrate having a plurality of gate stacks in a memory cell region and at least one gate stack in a peripheral device region;

forming caps made of one or more layers of a cap material over said plurality of gate stacks in said memory cell region and over said at least one gate stack in said peripheral device region;

forming a first contact hole between two neighboring gate stacks in said memory cell region;

exposing said cap of said at least one gate stack in said peripheral device region;

modifying said exposed cap of said at least one gate stack in said peripheral device region by removing said exposed cap from said at least one gate stack in said peripheral device region and depositing and structuring an additional cap material layer over said at least one gate stack in said peripheral device region in order to form a modified cap wherein said additional cap material layer is deposited and structured such that is forms a stress liner over said at least one gate stack in said peripheral device region;

forming at least one another contact hole in said peripheral device region, said at least one another contact hole exposing another contact area which is located either adjacent to said gate stack or in said gate stack in said peripheral device region; and filling said contact hole and said at least one another contact hole with a respective contact plug.

18. The method according to claim 17, wherein said cap comprises a first, second and third nitride layer and wherein said additional cap material layer is a fourth nitride layer.

19. The method according to claim 17 or 18, wherein said other contact area which is located adjacent to said gate stack in said peripheral device region is formed by exposing a part of a corresponding first active area and thereafter performing a silicidation process step in said exposed part.

20. The method according to claim 17, wherein the thickness of said additional cap material layer is chosen such that said at least one another contact hole exposing another contact area which is located adjacent to said gate stack in said peripheral device region can be formed in self-aligned manner.

21. The method according to claim 17, wherein a protective layer is formed between said caps of said plurality of gate stacks in said memory cell region and over said cap of said at least one gate stack in said peripheral device region; wherein a first spacer is structured from said protective layer adjacent to said cap of said at least one gate stack in said peripheral device region; wherein an ion implantation step using said first spacer as a mask is performed into said another contact area which is located adjacent to said gate stack in said peripheral device region.

22. The method according to claim 21, wherein after said ion implantation step the remaining protective layer is removed; and wherein another protective layer is formed between said caps of said plurality of gate stacks in said memory cell region and over said cap of said at least one gate stack in said peripheral device region; wherein a second spacer is structured from said another protective layer adjacent to said cap of said at least one gate stack in said peripheral device region; and wherein an etch step using said second spacer as a mask is performed to define the lateral dimensions of said another contact area which is located adjacent to said gate stack in said peripheral device region.

* * * * *

UNITED STATES PATENT AND TRADEMARK OFFICE
CERTIFICATE OF CORRECTION

PATENT NO. : 7,374,992 B2
APPLICATION NO. : 11/443602
DATED : May 20, 2008
INVENTOR(S) : Peter Baars et al.

It is certified that error appears in the above-identified patent and that said Letters Patent is hereby corrected as shown below:

On the Title page item 73, please fix the Assignee's name from "Oimonda AG" to --Qimonda AG--

Signed and Sealed this

Twenty-ninth Day of July, 2008

JON W. DUDAS
*Director of the United States Patent and Trademark Office*